United States Patent
Smith

(10) Patent No.: US 7,412,064 B2
(45) Date of Patent: Aug. 12, 2008

(54) PRESENCE CONTROL FOR GUITAR AMPLIFIER

(76) Inventor: Randall C. Smith, 1317 Ross St., Petaluma, CA (US) 94952

( * ) Notice: Subject to any disclaimer, the term of this patent is extended or adjusted under 35 U.S.C. 154(b) by 1443 days.

(21) Appl. No.: 10/391,637

(22) Filed: Mar. 20, 2003

(65) Prior Publication Data

US 2003/0179893 A1 Sep. 25, 2003

Related U.S. Application Data

(60) Provisional application No. 60/365,826, filed on Mar. 21, 2002.

(51) Int. Cl.
*G10H 1/00* (2006.01)
*H03F 21/00* (2006.01)
*H02B 1/00* (2006.01)

(52) U.S. Cl. .................. 381/118; 381/120; 381/123

(58) Field of Classification Search .................. 381/61, 381/118, 120, 123, 83, 93, 80, 98; 330/3, 330/118, 103, 104, 291, 293
See application file for complete search history.

(56) References Cited

U.S. PATENT DOCUMENTS

| 4,290,335 | A | * | 9/1981 | Sondermeyer | 381/98 |
|---|---|---|---|---|---|
| 5,131,044 | A | * | 7/1992 | Brown et al. | 381/61 |
| 5,197,102 | A | * | 3/1993 | Sondermeyer | 381/96 |
| 6,111,961 | A | * | 8/2000 | Hedrick et al. | 381/61 |
| 6,522,752 | B1 | * | 2/2003 | Smith | 381/61 |
| 6,724,897 | B1 | * | 4/2004 | Smith | 381/61 |

\* cited by examiner

*Primary Examiner*—Xu Mei
(74) *Attorney, Agent, or Firm*—White & Case LLP

(57) ABSTRACT

A guitar amplifier having at least one channel, each channel having a differential amplifier with first and second amplifying members, each amplifying member having a control element, an electron emitting element and an electron collecting element, the electron emitting elements of the amplifying members commonly coupled and an output amplifier coupled to the differential amplifier and having an output terminal selectively coupled to the control element of the second amplifying member of the differential amplifier as a feedback path. An input terminal coupled to the control element of the first amplifying member and a user-adjustable presence control circuit selectively coupled between the control element of the first amplifying member and ground to increase the perceived brightness, when selected. The presence control circuit includes a high pass filter disposed between the input terminal and ground to filter a selected high frequency portion of the signal received at the input terminal.

26 Claims, 2 Drawing Sheets

PRESENCE CONTROL FOR GUITAR AMPLIFIER

This application claims priority under 35 U.S.C. 119(e) based upon provisional application Ser. No. 60/365,826, filed Mar. 21, 2002.

BACKGROUND AND FIELD OF THE INVENTION

This invention relates to guitar amplifiers and, more specifically, to a vacuum tube guitar amplifier to provide presence control.

Presence controls for vacuum tube guitar amplifiers are well known and have been in use for many decades. Unlike preamplifier tone controls, the traditional presence control operates in the negative feedback loop of the power amplifier and phase splitter circuitry. Typically, the presence control allows player adjustment of a higher frequency range than a typical treble tone control and operates by attenuating to ground a portion of the negative feedback spectrum. Using a variable resistor as the control element, whatever portion of the negative feedback signal is deleted results in a corresponding increase in circuit gain and audible "brightness". In some traditional circuits, the fixed resistance value across the presence potentiometer may also be important as part of the driver circuit, in that case making maintenance of this fixed or maximum resistance necessary to insure proper circuit performance.

Some prior art guitar amplifiers include switchable performance parameters, including the ability to utilize or eliminate negative feedback. The sound of an amplifier with its feedback removed is characteristically very brash and aggressive, this sound having become extremely popular in current guitar music. In contrast to the so-called traditional "vintage" setting, which uses ample negative feedback and allows for a presence control, the non-negative feedback characteristic could be called "modern" sounding and is the tonal foundation for much of the heavy-metal, thrash and grunge styles of popular guitar music. Unfortunately however, the presence control is no longer functional in such "modern" circuits because the negative feedback on which it operates has been de-activated.

Over the years, a long felt need has arisen in that such so-called modern voicings (without negative feedback) might be overly bright and aggressive sounding, thus inviting some user-adjustable high-frequency attenuation. However, it is under precisely these conditions that the traditional presence control is no longer capable of functioning Even though traditional negative feedback style presence controls are only capable of increasing brightness (by attenuating high frequencies from the negative feedback), there is now the need for an adjustable control which does just the opposite and attenuates brightness. Further, confusion arises in the mind of the player when the knob on the amplifier control panel labeled "presence" becomes non-functional when modern performance is selected due to the absence of the negative feedback.

The obvious solution would appear to be merely a reduction of the negative feedback (rather than eliminating it entirely) which would leave the presence control at least partially functional. Unfortunately, this approach is, at best, a weak compromise because any residual negative feedback greatly diminishes the searing brashness of the modern sonic character while still not providing an audibly effective presence control. Thus, merely reducing negative feedback achieves neither the desired modern sonic amplifier characteristic nor does it provide for satisfactory presence control operation.

SUMMARY OF THE INVENTION

In accordance with the present invention, there is provided an improved presence control for a guitar amplifier which remedies the above noted problems.

The improved presence control in accordance with the present invention performs several functions to remedy the shortcomings of the prior art. First, the presence control in accordance with the present invention can retain faithful operation as a traditional presence control by rolling off negative feedback to boost the high frequency performance when the amplifier is set for its vintage voicing. Second, the presence control in accordance with the present invention can, if necessary, provide the correct fixed resistance to faithfully maintain traditional feedback and driver loading values. Third, the presence control in accordance with the present invention can be switchably reconfigured to function as a high frequency roll-off control when the negative feedback is deleted, this typically requiring a potentiometer value four to ten times greater than required in accordance with the circuit of the traditional presence control. The advantage of the lower resistance is to prevent all the action from occurring at the last increment of rotation. Impedance is low for feedback style and high for roll-off style. Furthermore, the improved presence control circuit in accordance with the present invention reverses the relative electrical rotation so that clockwise knob rotation for the presence control circuit always results in an increase in brightness, thus making the user largely unaware that so much (or anything) is going on behind the scene. This last feature is of considerable importance since the wiring of the traditional presence control is the reverse of normal. In a typically wired control, be it a treble or most any type of roll-off attenuator, clockwise rotation conventionally results in an increase in brightness by reducing circuit loading. But to maintain this conventional rotation, a traditional presence potentiometer must be wired "backwards" because it is an increasing reduction in negative feedback which causes an increase in brightness and this occurs as more (as opposed to less) of the selected frequencies of the negative feedback circuit are shunted to ground.

DESCRIPTION OF THE PREFERRED EMBODIMENT

Figure 1:
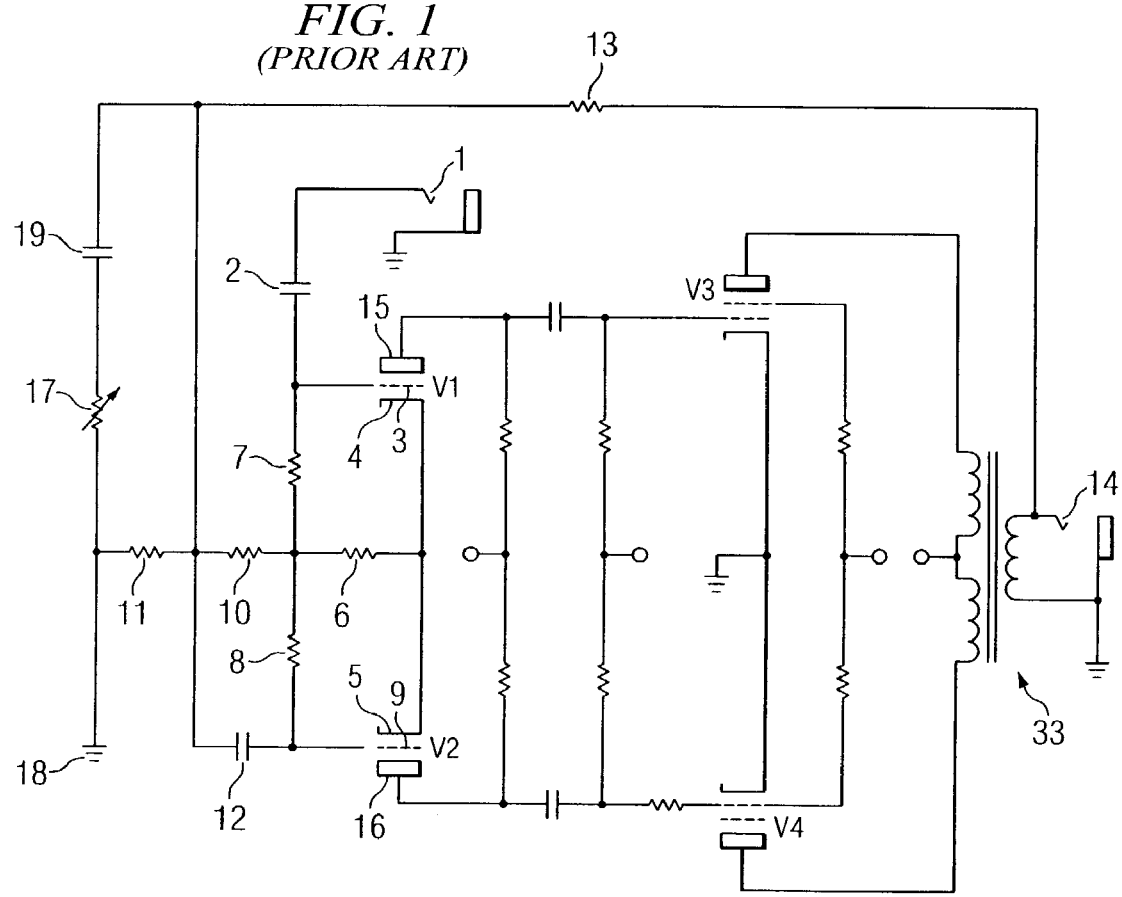
FIG. 1 is a schematic diagram showing typical prior art guitar amplifier circuitry with a traditional presence control.

Referring to FIG. 1, there is shown schematically a traditional push-pull vacuum tube power amplifier with its associated phase splitter circuit and a traditional presence control utilizing negative feedback. An input terminal 1 receives AC signal voltage from a guitar (or other) preamplifier not shown. A capacitor 2 couples the input signal voltage to the grid 3 of a triode voltage amplifier V1 which, together with triode V2, comprises a differential amplifier for providing opposed-phase driving voltages to a pair of standard push-pull power tubes V3 and V4 which operate in standard manner. Cathodes or electron emitting elements 4 and 5 of tubes V1 and V2 respectively are tied together and biased by resistor 6. Resistors 7, 8 provide grid leak and bias to grid 3 of tube V1 and to grid 9 of tube V2 respectively. Resistors 10 and 11 complete the biasing. Resistor 11 performs two other related functions. It is usually a fairly low resistance value and provides a path to ground through coupling capacitor 12 such that grid 9 is substantially operated in a grounded grid configuration. Thus, input signal to voltage amplifier V2 is provided via its cathode 5, receiving signal voltage from cathode 4 of tube V1 to which it is directly connected, and differential operation is obtained in the pair of tubes V1, V2. Resistor 11 also functions as the shunt element in a voltage divider whose series element is resistor 13. Resistor 13 conducts full bandwidth negative feedback voltage from the amplifier output terminal 14 of the push-pull amplifier portion composed of tube V3 and V4 via the output transformer 33 and couples the feedback signal through capacitor 12 to grid 9 of voltage amplifier tube V2. Drive signals of opposite phase are produced at the plates or electron collecting elements 15, 16 of voltage amplifier pair V1, V2 because amplifier tube V1 is driven by its grid 3 and inverts phase while amplifier tube V2 is driven by its cathode and does not invert. The component of the feedback signal which reaches grid 9 of tube V2 functions as negative feedback because it tends to drive the plate 16 of tube V2 in the opposite direction (inverting phase) from the majority of the input signal which is cathode coupled at cathode 5. A variable resistor 17 functions as a presence control by shunting to ground 18 a variable amplitude portion of the negative feedback voltage. The frequencies thus attenuated are determined by the values of capacitor 19 in conjunction with resistor 17. As any such voltage components thus attenuated are shunted to ground 18 through the presence control 17 and do not appear as negative feedback voltage at grid 9 of tube V2, a corresponding increase in voltage gain in amplifier V2 results. In traditional applications, the resistance of the presence control 17 is reduced as the knob is rotated in a clockwise direction, resulting in an increase in brightness as increased feedback signal is shunted to ground.

Figure 2:
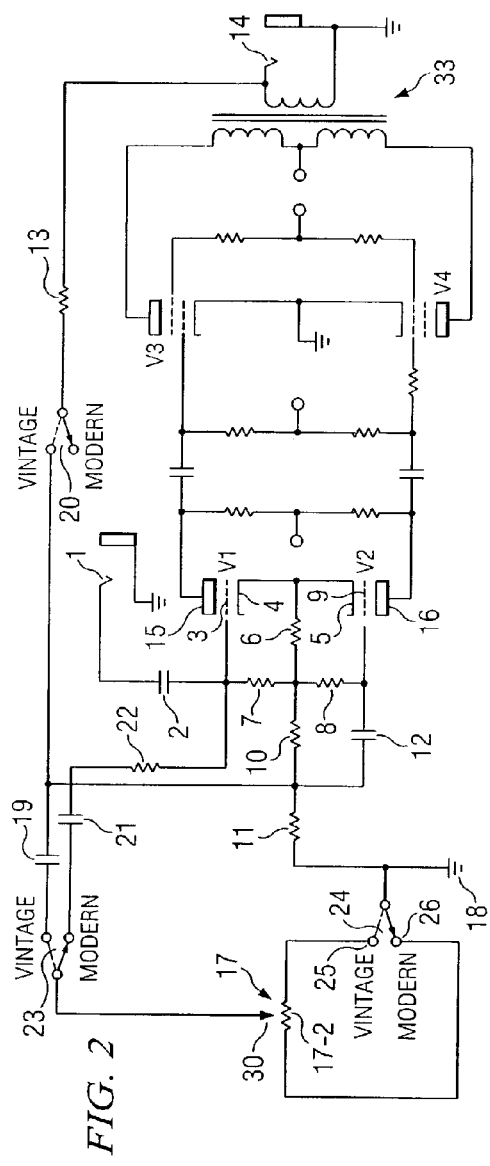
FIG. 2 is a schematic diagram showing a first preferred embodiment in accordance with the present invention.

Referring to FIG. 2, there is shown the same basic driver and output circuit as in FIG. 1 with all the common components sharing identical functions and character references. For convenience herein, the term "vintage" will again refer to standard prior art and its performance as described with reference to FIG. 1 while the term "modern" again being used to describe the circuit and its performance when negative feedback is deleted. A switch 20 has been added and is used to selectively interrupt the path of the feedback signal originating from the output terminal 14 and to switch the amplifier into its modern performance voicing. Unfortunately, the removal of negative feedback also deactivates the traditional presence control 17 which, as described with reference to FIG. 1, requires feedback in order to function. Moreover, there has been a long felt need on the part of the musician to be able to variably roll off some of the increased brightness that results from using the amplifier in its modern no-feedback mode. In FIG. 2, a capacitor 21 is arranged in series with a resistor 22 to provide a high pass network connected from the input grid 3 of amplifier V1 to the modern terminal of switch 23 as shown by the solid arrow. The vintage terminal of switch 23 is connected through capacitor 19 to the feedback path as shown by the broken line. The common terminal of switch 23 is connected to the wiper 30 of presence control potentiometer 17-2. Thus, the function of switch 23 is to selectively couple one of the high pass filter composed of capacitor 21 and resistor 22 or the feedback capacitor 19 to the wiper element 30 of presence control potentiometer 17-2.

An additional single-pole-double-throw switch 24 has its common connected to ground 18 and its vintage and modern terminals coupled to opposite ends 25, 26 of the fixed total resistance across presence potentiometer 17-2. The function of switch 24 is to effectively reverse the rotation of the potentiometer 17-2 with respect to its resistance to ground 18. When functioning as a high-pass roll-off filter in the modern mode, clockwise rotation of the presence control 17-2 increases perceived brightness by increasing the resistance from ground and lessening the roll-off of high signal frequencies applied to grid 3 of tube V1. When alternately functioning in the traditional feedback configuration as illustrated by the broken lines at switches 20, 23 and 24, clockwise rotation of the potentiometer 17-2 increases perceived brightness by decreasing the resistance to ground and shunting more brightness frequencies out of the feedback signal as applied to grid 9 of tube V2, thus providing the desired improvement over the prior art circuit as above described.

Figure 3:
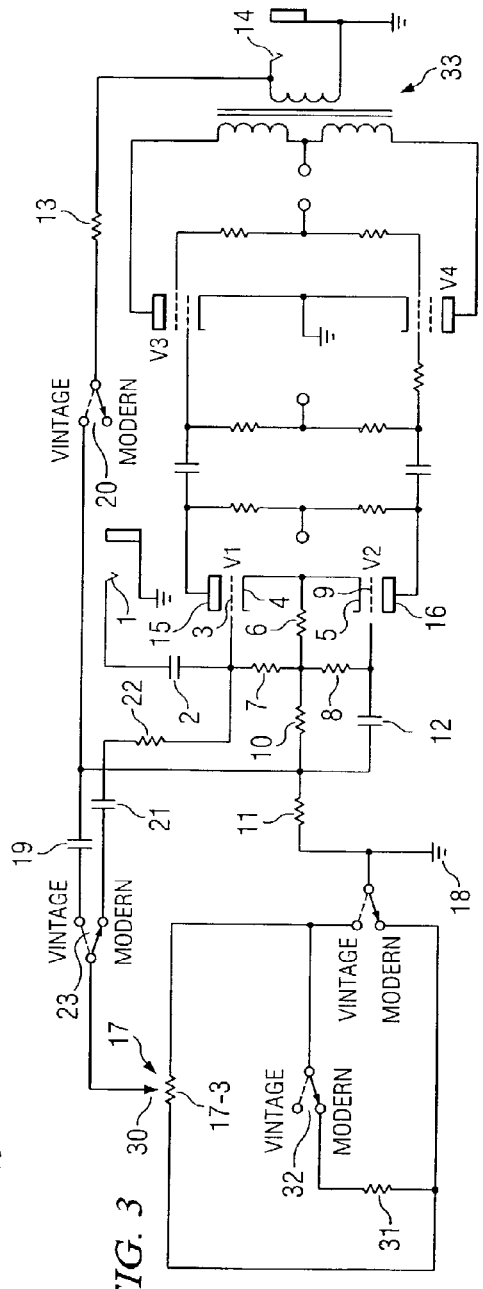
FIG. 3 is a schematic diagram showing a second preferred embodiment in accordance with the present invention.

The circuitry of FIG. 3 illustrates a further preferred embodiment of the present invention by including one further element in addition to the circuitry of FIG. 2. Again, all common references, functions and reference numbers remain the same in FIG. 3 as in FIGS. 1 and 2. In order to optimize performance of the improved presence control as described above, it may be desirable to effectively alter the total fixed resistance of the potentiometer 17-3. In the circuit of FIG. 3, an additional switch 30 has been added to the circuitry of FIG. 2 along with a resistor 31. To accommodate the higher impedance of grid 3 of tube V1 and the high pass filter composed of capacitor 21 and resistor 22, a four to ten time higher value of resistance across the presence control 17-3 than would be normally used permits a greater range of effectiveness when operating in the modern mode. If such a higher value potentiometer is used as the presence control 17-3, then a further refinement is obtained by the switch 32 coupling fixed resistor 31 to ground 18 from the wiper 30 such that the overall resistance range in the vintage mode more closely resembles the original lower value of the potentiometer 17. This reference improves the effective taper and response range of the presence control 17-3 when operating in either the vintage or the modern configuration.

While the above description has been provided assuming a guitar amplifier with a single channel, it should be understood that there can be multiple channels of the type depicted above, each with its own presence control. The channels can be connected in parallel or operate individually to provide rapid selection of an operating mode.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

The invention claimed is:

1. A guitar amplifier which comprises at least one channel, each channel having:
  (a) a differential amplifier having first and second amplifying members, each of said amplifying members having a control element, an electron emitting element and an electron collecting element, the electron emitting elements of said amplifying members being commonly coupled and an output amplifier coupled to said differential amplifier and having an output terminal selectively coupled to said control element of said second amplifying member of said differential amplifier as a feedback path;

(b) an input terminal coupled to the control element of said first amplifying member; and (c) a user-adjustable presence control circuit selectively coupled between said control element of said first amplifying member and ground to, when selected, increase the perceived brightness by increasing the resistance from ground and lessening the roll off of high signal frequencies applied to the control element of the first amplifying member and boosting high frequencies when said feedback path is completed.

2. The amplifier of claim 1 wherein said presence control circuit further includes a high pass filter disposed between said input terminal and ground to filter a selected high frequency portion of said signal received at said input terminal.

3. The amplifier of claim 1 further including switch means to one of concurrently operationally decouple said feedback path and operationally couple said presence control from and to said amplifier circuit or concurrently operationally couple said feedback path and operationally decouple said presence control from said amplifier circuit.

4. The amplifier of claim 2 further including switch means to one of concurrently operationally decouple said feedback path and operationally couple said presence control from and to said amplifier circuit or concurrently operationally couple said feedback path and operationally decouple said presence control from said amplifier circuit.

5. The amplifier of claim 1 wherein said presence control includes a potentiometer coupled between said input terminal and said control element of said second amplifying member.

6. The amplifier of claim 2 wherein said presence control includes a potentiometer coupled between said input terminal and said control element of said second amplifying member.

7. The amplifier of claim 3 wherein said presence control includes a potentiometer coupled between said input terminal and said control element of said second amplifying member.

8. The amplifier of claim 4 wherein said presence control includes a potentiometer coupled between said input terminal and said control element of said second amplifying member.

9. The amplifier of claim 5 further including a resistor in parallel with said potentiometer.

10. The amplifier of claim 6 further including a resistor in parallel with said potentiometer.

11. The amplifier of claim 7 further including a resistor in parallel with said potentiometer.

12. The amplifier of claim 8 further including a resistor in parallel with said potentiometer.

13. The amplifier of claim 5 further including switch means having a pair of terminals, each of said terminals coupled to a different end of said potentiometer, and a wiper selectively coupled to one of said terminals and to said control element of said second amplifying member.

14. The amplifier of claim 6 further including switch means having a pair of terminals, each of said terminals coupled to a different end of said potentiometer, and a wiper selectively coupled to one of said terminals and to said control element of said second amplifying member.

15. The amplifier of claim 7 further including switch means having a pair of terminals, each of said terminals coupled to a different end of said potentiometer, and a wiper selectively coupled to one of said terminals and to said control element of said second amplifying member.

16. The amplifier of claim 8 further including switch means having a pair of terminals, each of said terminals coupled to a different end of said potentiometer, and a wiper selectively coupled to one of said terminals and to said control element of said second amplifying member.

17. The amplifier of claim 1 wherein said differential amplifier is composed of vacuum tubes.

18. The amplifier of claim 2 wherein said differential amplifier is composed of vacuum tubes.

19. The amplifier of claim 4 wherein said differential amplifier is composed of vacuum tubes.

20. The amplifier of claim 8 wherein said differential amplifier is composed of vacuum tubes.

21. An amplifier for an electric guitar having an input terminal and an output terminal, which comprises:
    a switchably deletable negative feedback circuit coupled to the output terminal; and
    an adjustable presence control circuit selectively operable in two configurations, one of said configurations shunting to ground an increasing portion of a high-frequency component of the negative feedback voltage and a second configuration deleting said negative feedback and, in conjunction with a high pass filter coupled to the input terminal, decreasing perceived amplifier brightness by shunting to ground an increasing portion of the signal voltage from said high pass filter.

22. The amplifier of claim 21, said presence control further including a variable resistor having a pair of opposing ends and a wiper movable between the ends selectively coupled to one of said two configurations and a switch selectively coupling one of said ends to ground.

23. The amplifier of claim 21 wherein said adjustable presence control circuit selectively operable in two configurations includes a double-pole-double-throw device.

24. The amplifier of claim 22 wherein said adjustable presence control circuit selectively operable in two configurations includes a double-pole-double-throw device.

25. The amplifier of claim 22 further including an additional resistive element selectively connected across said variable resistor.

26. The amplifier of claim 24 further including an additional resistive element selectively connected across said variable resistor.

* * * * *